(12) United States Patent
Ueno

(10) Patent No.: US 11,152,502 B2
(45) Date of Patent: Oct. 19, 2021

(54) NITRIDE SEMICONDUCTOR DEVICE

(71) Applicant: FUJI ELECTRIC CO., LTD., Kawasaki (JP)

(72) Inventor: Katsunori Ueno, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 16 days.

(21) Appl. No.: 16/800,564

(22) Filed: Feb. 25, 2020

(65) Prior Publication Data
US 2020/0365725 A1 Nov. 19, 2020

(30) Foreign Application Priority Data
May 17, 2019 (JP) ................................ JP2019-93559

(51) Int. Cl.
*H01L 29/78* (2006.01)
*H01L 29/423* (2006.01)
*H01L 29/20* (2006.01)

(52) U.S. Cl.
CPC ...... *H01L 29/7813* (2013.01); *H01L 29/2003* (2013.01); *H01L 29/4236* (2013.01)

(58) Field of Classification Search
CPC ............. H01L 29/7813; H01L 29/2003; H01L 29/4236
USPC ........................................................ 257/330
See application file for complete search history.

(56) References Cited

U.S. PATENT DOCUMENTS

| 8,178,920 B2 | 5/2012 | Nakamura et al. |
| 10,256,336 B2* | 4/2019 | Fujita ................ H01L 29/41775 |
| 10,910,478 B1* | 2/2021 | Xu ........................... H01L 29/36 |
| 2007/0187695 A1 | 8/2007 | Nakamura et al. |
| 2010/0019250 A1 | 1/2010 | Nakamura et al. |
| 2014/0008664 A1* | 1/2014 | Kudou .............. H01L 29/66666 257/77 |
| 2015/0155355 A1* | 6/2015 | Losee ............... H01L 29/66704 257/77 |

FOREIGN PATENT DOCUMENTS

| JP | 5-343691 A | 12/1993 |
| JP | 8-102538 A | 4/1996 |
| JP | 2007-194283 A | 8/2007 |
| WO | 2016/067374 A1 | 5/2016 |

* cited by examiner

*Primary Examiner* — Igwe U Anya

(57) ABSTRACT

The nitride semiconductor device includes: a nitride semiconductor layer; a first conductivity type source region provided on a surface of the nitride semiconductor layer; a second conductivity type well region provided in the nitride semiconductor layer and adjacent to the source region in a first direction parallel to the surface and in a second direction intersecting with the first direction; a trench located on the opposite side of the source region with the well region sandwiched therebetween in the first direction; a first conductivity type impurity region located between the well region and the trench; an insulating film provided on a bottom surface of the trench; a gate insulating film provided on the well region; and a gate electrode provided from on the insulating film to on the gate insulating film. A thickness of the insulating film is larger than a thickness of the gate insulating film.

11 Claims, 11 Drawing Sheets

NITRIDE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2019-093559 filed on May 17, 2019, the entire contents of which is incorporated by reference herein.

TECHNICAL FIELD

The present invention relates to a nitride semiconductor device.

BACKGROUND ART

Conventionally, a structure in which a trench is provided in a drift region of a semiconductor substrate and a gate insulating film and a gate electrode are provided in the trench is known (for example, refer to WO 2016/067374).

SUMMARY OF INVENTION

A nitride semiconductor device capable of reducing a capacity of a gate electrode is desired.

The present invention has been made in view of the above problem, and it is an object of the present invention to provide a nitride semiconductor device capable of reducing a capacity of a gate electrode.

In order to solve the above problem, a nitride semiconductor device according to one mode of the present invention includes: a nitride semiconductor layer; a first conductivity type source region; a second conductivity type well region; a trench; a first conductivity type impurity region; an insulating film; a gate insulating film; and a gate electrode. The first conductivity type source region is provided on a side of a surface of the nitride semiconductor layer. The second conductivity type well region is provided in the nitride semiconductor layer and adjacent to the source region in a first direction parallel to the surface of the nitride semiconductor layer and in a second direction intersecting with the first direction. The trench is provided in the nitride semiconductor layer and located on the opposite side of the source region with the well region sandwiched between the trench and the source region in the first direction. The first conductivity type impurity region is provided in the nitride semiconductor layer and located between the well region and the trench. The insulating film is provided on a bottom surface of the trench. The gate insulating film is provided on the well region. The gate electrode is provided from on the insulating film to on the gate insulating film. A thickness of the insulating film is larger than a thickness of the gate insulating film.

According to the present invention, a nitride semiconductor device capable of reducing a capacity of a gate electrode can be provided.

DETAILED DESCRIPTION

Figure 1:
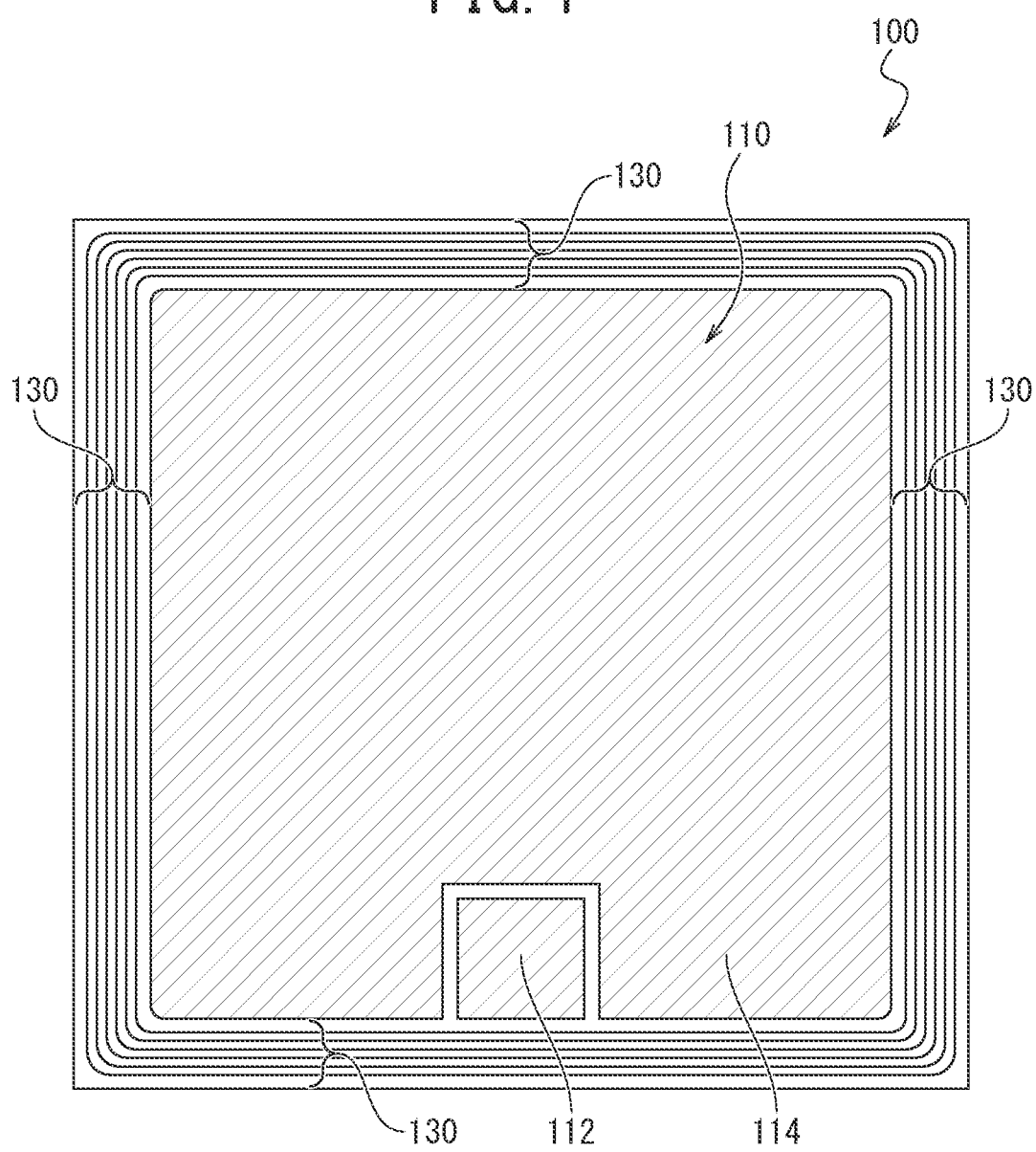
FIG. 1 is a plan view illustrating a configuration example of a gallium nitride semiconductor device according to a first embodiment of the present invention.

Embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

Moreover, in the following description, a Z-axis positive direction is sometimes referred to as "up", and a Z-axis negative direction is sometimes referred to as "down". The terms "up" and "down" do not necessarily mean the vertical direction with respect to the ground. In other words, the directions of "up" and "down" are not limited to the direction of gravitational force. The terms "up" and "down" are merely convenient expressions for identifying relative positional relations in regions, layers, films, substrates, and the like and do not limit the technical idea of the present invention. It is certain that, when the plane of paper is rotated by 180 degrees, for example, "up" is changed to "down" and "down" is changed to "up".

Furthermore, in the following description, the case where a first conductivity type is an N type and a second conductivity type is a P type is illustratively described. However, the relation between the conductivity types may be reversed such that the first conductivity type is a P type and the second conductivity type is an N type. In addition, "+" or "−" added to "P" or "N" means that a semiconductor region has an impurity concentration relatively higher or lower than that of a semiconductor region without "+" or "−". However, it does not mean that, in semiconductor regions having the same P, the impurity concentrations of the semiconductor regions are strictly the same.

First Embodiment

Configuration Example of GaN Semiconductor Device

FIG. 1 is a plan view illustrating a configuration example of a gallium nitride semiconductor device (an example of a "nitride semiconductor device" of the present invention; hereinafter, GaN semiconductor device) according to a first embodiment of the present invention. FIG. 1 is an X-Y plan view. An X-axis direction (an example of a "first direction" of the present invention) and a Y-axis direction are directions parallel to a surface 20a of a GaN layer 20 described below (refer to FIG. 2). The X-axis direction is also a width direction of a trench 30 described below (refer to FIG. 2). A Z-axis direction (an example of a "second direction" of the present invention) is a direction perpendicular to the surface 20a of the GaN layer 20. The Z-axis direction is also a depth direction of the trench 30 described below. The X-axis direction, the Y-axis direction, and the Z-axis direction are perpendicular to one another.

As illustrated in FIG. 1, a GaN semiconductor device 100 has an active region 110 and an edge termination region 130. The active region 110 has a gate pad 112 and a source pad 114. The gate pad 112 and the source pad 114 are electrode pads electrically and respectively connected to a gate electrode 51 and a source electrode 53 described below.

The edge termination region 130 surrounds the periphery of the active region 110 in a plan view from the Z-axis direction. The edge termination region 130 may have one or more of a guard ring structure, a field plate structure, and a JTE (Junction Termination Extension) structure. The edge termination region 130 may have a function of preventing electric field concentration in the active region 110 by expanding a depletion layer generated in the active region 110 to the edge termination region 130.

Configuration Example of Vertical MOSFET

Figure 2:
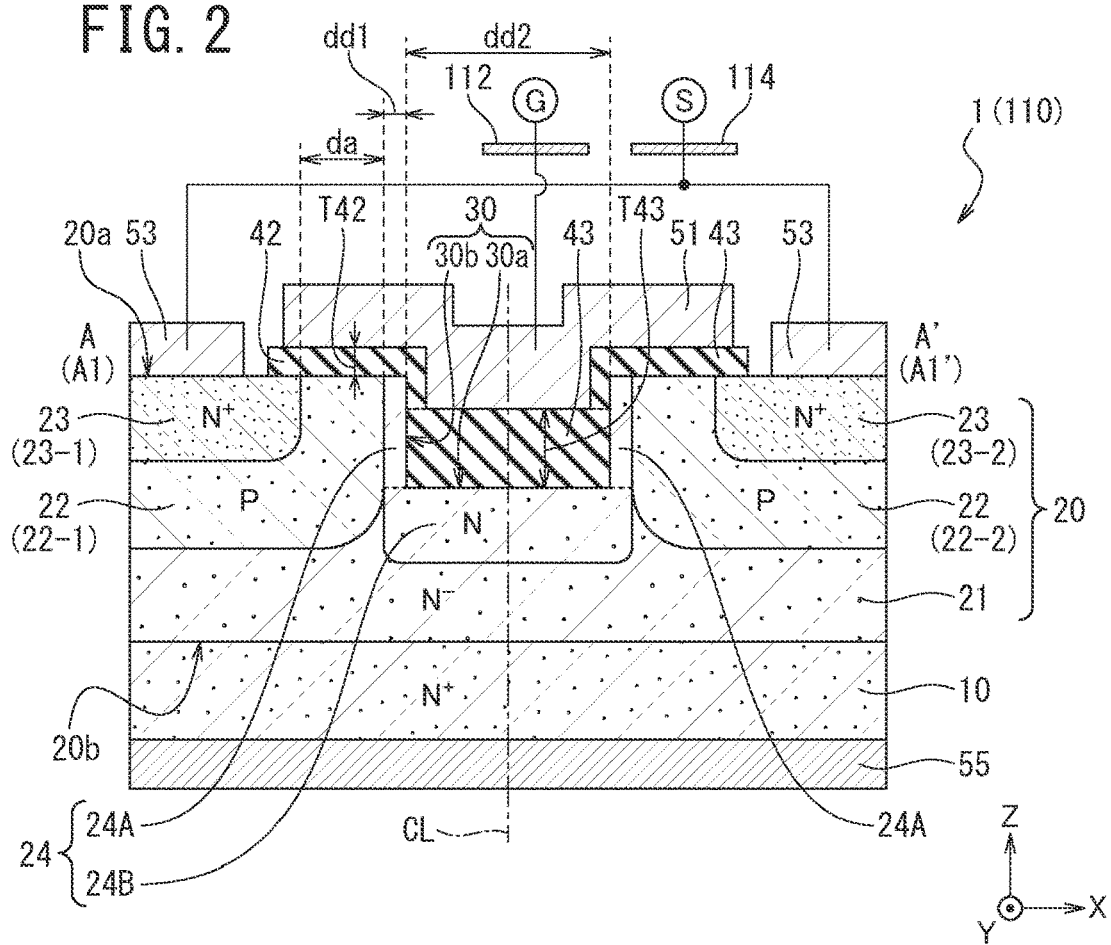
FIG. 2 is a cross-sectional view illustrating a configuration example of a vertical MOSFET according to the first embodiment of the present invention.
Figure 3:
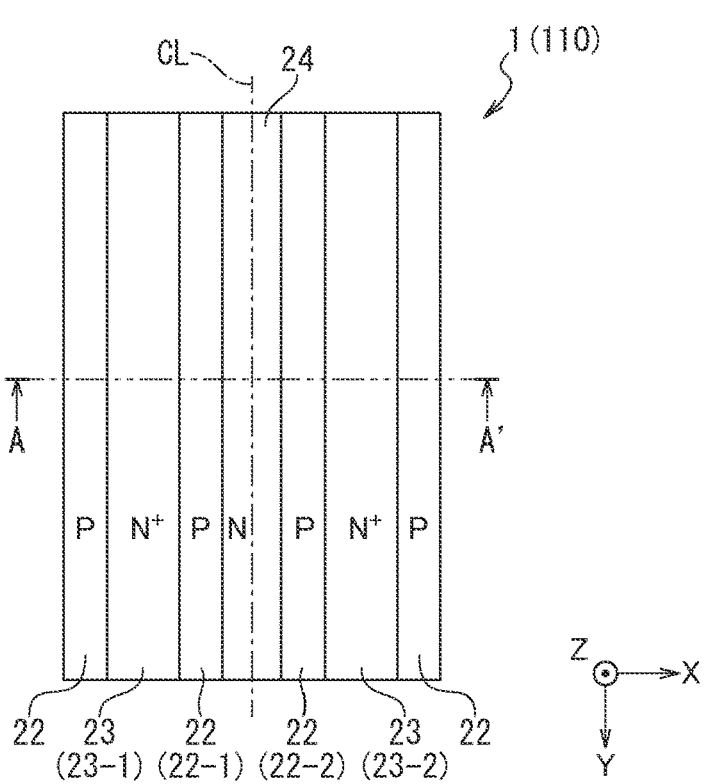
FIG. 3 is a plan view illustrating a configuration example of a side of a surface of a gallium nitride semiconductor layer in the vertical MOSFET according to the first embodiment of the present invention.

FIG. 2 is a cross-sectional view illustrating a configuration example of a vertical MOSFET (Metal Oxide Semiconductor Field Effect Transistor) 1 according to the first embodiment of the present invention. FIG. 2 illustrates a repetitive unit structure of the vertical MOSFET 1 included in the active region 110 illustrated in FIG. 1. FIG. 3 is a plan view illustrating a configuration example of a side of the surface 20a of the gallium nitride semiconductor layer (hereinafter, GaN layer) 20 in the vertical MOSFET 1 according to the first embodiment of the present invention. A cross-section cut along the line A-A' of FIG. 3 corresponds to the cross-sectional view of FIG. 2.

The GaN semiconductor device 100 includes a plurality of the vertical MOSFETs 1 illustrated in FIG. 2. In the GaN semiconductor device 100, the vertical MOSFETs 1 are repeatedly provided in the X-axis direction. In FIG. 2 and FIG. 3, a virtual line CL is illustrated for conveniently describing the structure of the vertical MOSFET 1. The virtual line CL is a straight line parallel to the Z-axis direction and passes through the center of the unit structure illustrated in FIG. 2 in the X-axis direction.

As illustrated in FIG. 2, the vertical MOSFET 1 has a gallium nitride substrate (hereinafter, GaN substrate) 10, the GaN layer 20, the trench 30 provided in the GaN layer 20, a gate insulating film 42, an insulating film 43 provided on a bottom surface 30a of the trench 30, the gate electrode 51, the source electrode 53, and a drain electrode 55.

The GaN substrate 10 is a GaN single-crystalline substrate. The GaN substrate 10 is a first conductivity type (N type) substrate and is, for example, a N⁺ type substrate. An N type impurity contained in the GaN substrate 10 is one or more elements among Si (silicon), O (oxygen), and Ge (germanium). In one example, the N type impurity contained in the GaN substrate 10 is Si or O, and the impurity concentration of Si or O in the GaN substrate 10 is $2 \times 10^{18}$ cm$^{-3}$ or more.

The GaN substrate 10 may be a low-dislocation free-standing substrate having a dislocation density of less than $1 \times 10^{7}$ cm$^{-2}$. When the GaN substrate 10 is the low-dislocation free-standing substrate, the dislocation density of the GaN layer 20 formed on the GaN substrate 10 also becomes low. By using the low-dislocation substrate for the GaN substrate 10, even when a large-area power device is formed on the GaN substrate 10, a leakage current in the power device can be reduced. Accordingly, a manufacturing apparatus can manufacture the power device at a high yield rate. In addition, deep diffusion of an ion-implanted impurity along the dislocation in heat treatment can be prevented.

The GaN layer 20 is provided on a surface 10a of the GaN substrate 10. The GaN layer 20 is a GaN single-crystalline layer and is a layer epitaxially formed on the surface of the GaN substrate 10. An N type drift region 21, a P type well region 22, a N⁺ type source region 23, and an N type JFET region 24 (an example of an "impurity region" of the present invention) are provided in the GaN layer 20.

The drift region 21 functions as a current pathway between the GaN substrate 10 and the JFET region 24. The drift region 21 is formed by doping of an N type impurity in the process of epitaxial growth for forming the GaN layer 20. The drift region 21 has an N type impurity concentration lower than that of each of the source region 23 and the JFET region 24.

The well region 22 is formed by doping of a P type impurity in the process of epitaxial growth for forming the GaN layer 20. Alternatively, as described in the following first modified example, the well region 22 may be formed by ion implantation of a P type impurity to a predetermined depth from the surface 20a of the GaN layer 20 and heat treatment. In the well region 22, a part in contact with the gate insulating film 42 and the vicinity thereof become a channel region of the vertical MOSFET 1.

The source region 23 is provided on the side of the surface 20a of the GaN layer 20 and is located on the inside of the well region 22. In the X-axis direction, the Y-axis direction, and the Z-axis direction, the source region 23 and the well region 22 are in contact with each other. The source region 23 is formed by ion implantation of an N type impurity to a predetermined depth from the surface 20a of the GaN layer 20 and heat treatment.

The JFET region 24 is located around the trench 30 and functions as a current pathway between the drift region 21 and the well region 22. The JFET region 24 is formed by ion implantation of an N type impurity to a predetermined depth from the surface 20a of the GaN layer 20 and heat treatment. The JFET region 24 has a first JFET region 24A (an example of a "first impurity region" of the present invention) and a second JFET region 24B (an example of a "second impurity region" of the present invention) adjacent to the first JFET region 24A in the Z-axis direction. The second JFET region 24B is located closer to a rear surface 20b of the GaN layer 20 than the first JFET region 24A.

For example, the first JFET region 24A is located between the trench 30 and the well region 22 in the X-axis direction. The first JFET region 24A faces a side surface 30b of the trench 30 and is adjacent to the well region 22. The second JFET region 24B is located between the trench 30 and the rear surface 20b of the GaN layer 20 in the Z-axis direction. The second JFET region 24B faces the bottom surface 30a of the trench 30 and is adjacent to the drift region 21. The first JFET region 24A has an N type impurity concentration higher than that of the second JFET region 24B.

As illustrated in FIG. 2 and FIG. 3, in the repetitive unit structure of the vertical MOSFET 1, the well region 22 has a first well region 22-1 and a second well region 22-2. The first well region 22-1 and the second well region 22-2 are arranged in line symmetry with respect to the virtual line CL. Similarly, in the repetitive unit structure of the vertical MOSFET 1, the source region 23 has a first source region 23-1 and a second source region 23-2. The first source region 23-1 and the second source region 23-2 are arranged in line symmetry with respect to the virtual line CL.

Each of the first source region 23-1 and the second source region 23-2 is provided on the side of the surface 20a of the GaN layer 20. The first source region 23-1 is located on the inside of the first well region 22-1 and is in contact with the first well region 22-1 in the X-axis direction, the Y-axis direction, and the Z-axis direction. Similarly, the second source region 23-2 is located on the inside of the second well region 22-2 and is in contact with the second well region 22-2 in the X-axis direction, the Y-axis direction, and the Z-axis direction.

As illustrated in FIG. 2, the trench 30 is located in a region sandwiched between the first well region 22-1 and the second well region. In other words, in the X-axis direction, the trench 30 is located on the opposite side of the first source region 23-1 with the first well region 22-1 sandwiched between the trench 30 and the first source region 23-1. The trench 30 is located on the opposite side of the second source region 23-2 with the second well region 22-2 sandwiched between the trench 30 and the second source region 23-2. The virtual line CL passes through the center of the trench 30 in the X-axis direction (i.e., the center in the width direction).

In the well region 22, an acceptor concentration obtained by subtracting the N type impurity concentration from the P type impurity concentration is defined as Na. In the well region 22, a length of a part covered with the gate insulating film 42 in the X-axis direction is defined as da. In the first JFET region 24A, a donor concentration obtained by subtracting the P type impurity concentration from the N type impurity concentration is defined as Nd1. A length of the first JFET region 24A in the X-axis direction is defined as dd1. A donor concentration in the second JFET region 24B is defined as Nd2. A length of the second JFET region 24B in the X-axis direction is defined as dd2. In this case, preferably, the vertical MOSFET 1 satisfies the following equation (1). The vertical MOSFET 1 can increase an off-state breakdown voltage between the drain and the source by satisfying the following equation (1).

$$Na \times da > Nd1 \times dd1 > Nd2 \times dd2 \quad (1)$$

Alternatively, the P type impurity concentration in the well region 22 may be defined as NA, the N type impurity concentration in the first JFET region 24A may be defined as ND1, and the N type impurity concentration in the second JFET region 24B may be defined as ND2. In the case of NA≈Na, ND1≈Nd1, and ND2≈Nd2, preferably, the vertical MOSFET 1 satisfies the following equation (1)'. The vertical MOSFET 1 produces a similar effect to the case of satisfying the above equation (1) by satisfying the following equation (1)'.

$$NA \times da > ND1 \times dd1 > ND2 \times dd2 \quad (1)'$$

The gate insulating film 42 is provided on the well region 22. The gate insulating film 42 is, for example, a silicon dioxide film ($SiO_2$ film) or an aluminum oxide ($Al_2O_3$) film. The insulating film 43 is provided on the bottom surface 30a of the trench 30 (i.e., on the second JFET region 24B). The insulating film 43 is, for example, a $SiO_2$ film or an $Al_2O_3$ film. The gate insulating film 42 and the insulating film 43 are adjacent to each other. A thickness T43 of the insulating film 43 is larger than a thickness T42 of the gate insulating film 42. For example, the thickness T42 of the gate insulating film 42 is 50 nm or more and 100 nm or less. The thickness T43 of the insulating film 43 is 100 nm or more and 1 μm or less. The thickness T43 of the insulating film 43 is the maximum value of the thickness T42 of the gate insulating film 42 at a minimum and is about a depth T30 of the trench 30 (refer to FIG. 4B described below) at a maximum.

The gate electrode 51 is provided continuously from on the gate insulating film 42 to on the insulating film 43. The gate electrode 51 is a planar electrode provided on the flat gate insulating film 42. For example, the gate electrode 51 is formed by a material different from that of the gate pad 112. The gate electrode 51 is formed by polysilicon doped with an impurity, and the gate pad 112 is formed by Al or Al—Si alloy.

The source electrode 53 is provided on the source region 23 and is electrically connected to the source region 23. The source electrode 53 may be provided so as to cover the gate electrode 51 through an interlayer insulating film which is not illustrated.

The source electrode 53 is formed by the same material as that of the source pad 114. For example, the source electrode 53 and the source pad 114 are made of Al or Al—Si alloy. In addition, the source electrode 53 may have a barrier metal layer between the source electrode 53 and the surface 20a of the GaN layer 20. As the material for the barrier metal layer, titanium (Ti) may be used. In other words, the source electrode 53 may be a laminate of the Ti layer and the Al layer or a laminate of the Ti layer and the Al—Si alloy layer. The source electrode 53 may be an electrode doubling as the source pad 114 or may be an electrode provided separately from the source pad 114.

The drain electrode 55 is provided on the side of a rear surface of the GaN substrate 10 and is electrically connected to the GaN substrate 10. The drain electrode 55 is also composed of a similar material to that of the source electrode 53.

Manufacturing Method

Next, a manufacturing method of the vertical MOSFET 1 according to the first embodiment of the present invention will be described. FIGS. 4A to 4E are cross-sectional views illustrating the manufacturing method of the vertical MOSFET 1 according to the first embodiment of the present invention in the order of steps. The vertical MOSFET 1 is manufactured by various manufacturing apparatuses such as a deposition apparatus, an exposure apparatus, and an etching apparatus.

Figure 4A:
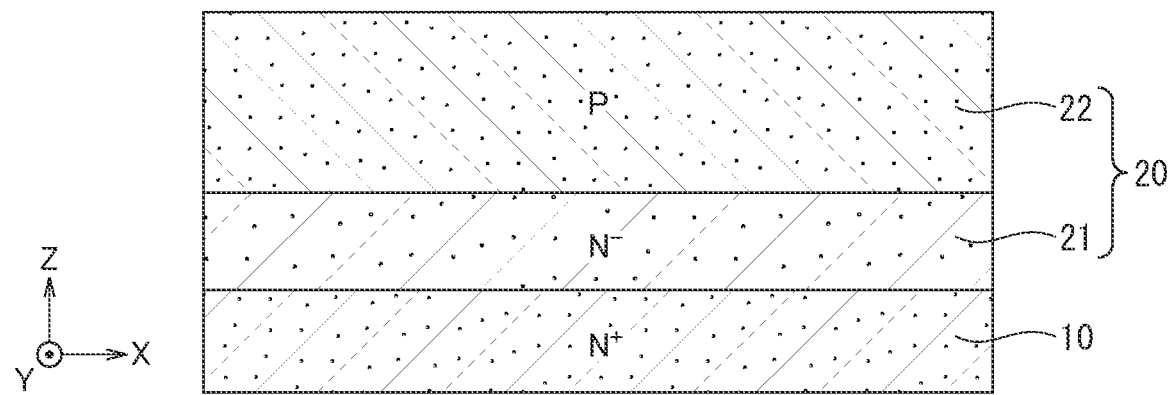
FIGS. 4A to 4E are cross-sectional views illustrating a manufacturing method of the vertical MOSFET according to the first embodiment of the present invention in the order of steps.

As illustrated in FIG. 4A, a manufacturing apparatus forms the GaN layer 20 on the GaN substrate 10. For example, the manufacturing apparatus epitaxially forms the GaN layer 20 on the N$^+$ type GaN substrate 10 by metalorganic chemical vapor deposition (MOCVD), halide vapor phase epitaxy (HVPE), or the like. In the forming step of the GaN layer 20, the drift region 21 containing Si as an N type impurity and the well region 22 containing Mg as a P type impurity are continuously formed.

In the process of epitaxially forming the GaN layer 20, the drift region 21 is formed by making an impurity contained in the GaN layer 20 an N type impurity. In addition, the well region 22 is formed in the GaN layer 20 by changing the impurity contained in the GaN layer 20 from the N type impurity such as Si to the P type impurity such as Mg. The concentration of Si in the drift region 21 is, for example, $5 \times 10^{15}$ cm$^{-3}$ or more and $5 \times 10^{16}$ cm$^{-3}$ or less. The thickness of the drift region 21 is, for example, 5 μm or more and 50 μm or less. The concentration of Mg in the well region 22 is, for example, $5 \times 10^{16}$ cm$^{-3}$ or more and $5 \times 10^{17}$ cm$^{-3}$ or less. The thickness of the well region 22 is, for example, 0.5 μm or more and 2 μm or less.

Figure 4B:
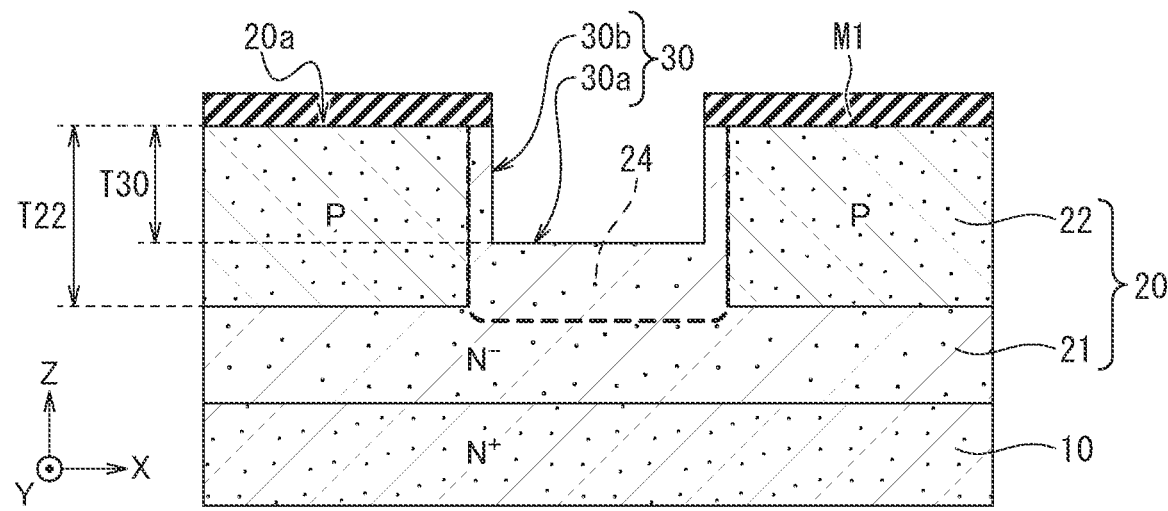

Next, as illustrated in FIG. 4B, the manufacturing apparatus forms a mask M1 on the GaN layer 20. The mask M1 is composed of a SiO$_2$ film, an Al$_2$O$_3$ film, or a photoresist which can be selectively removed with respect to the GaN layer 20. The mask M1 has a shape in which the upper part of a region in which the trench 30 is to be formed (hereinafter, a trench forming region) is opened and the upper part of the other region is covered. The manufacturing apparatus forms the trench 30 in the GaN layer 20 by etching the part exposed from the mask M1 in the GaN layer 20. The manufacturing apparatus forms the trench 30 to be shallower than the well region 22. In other words, when a depth from the surface 20a of the GaN layer 20 to the bottom surface 30a of the trench 30 is defined as T30 and a depth from the surface 20a of the GaN layer 20 to a bottom surface of the well region 22 is defined as T22, the manufacturing apparatus forms the trench 30 such that T30 < T22. For example, the depth T30 is 0.2 μm or more and 1 μm or less. The depth T22 is 0.5 μm or more and 1.5 μm or less.

Next, the manufacturing apparatus performs ion implantation of O or Si as an N type impurity in the GaN layer 20 to a region 24' in which the JFET region 24 (refer to FIG. 2) is to be formed (hereinafter, a JFET forming region). The dose amount of the N type impurity is $5 \times 10^{11}$ cm$^{-2}$ or more and $1 \times 10^{13}$ cm$^{-2}$ or less. In the ion implantation step, the manufacturing apparatus introduces more N type impurity into the side surface 30b than the bottom surface 30a of the trench 30.

For example, after performing first ion implantation to the bottom surface 30a and the side surface 30b of the trench 30, the manufacturing apparatus removes the mask M1. Next, the manufacturing apparatus forms a mask (not illustrated) having a shape in which the side surface 30b of the trench 30 is exposed and the other region (including the bottom surface 30a of the trench 30) is covered. Then, the manufacturing apparatus performs second ion implantation to the side surface exposed from the mask. Accordingly, the manufacturing apparatus can introduce more N type impurity into the side surface 30b than the bottom surface 30a of the trench 30.

Alternatively, the manufacturing apparatus may introduce more N type impurity into the side surface 30b of the trench 30 by performing ion implantation of an N type impurity before forming the trench 30. For example, the manufacturing apparatus performs ion implantation in the GaN layer 20 to the trench forming region exposed from the mask M1. In the ion implantation, the manufacturing apparatus makes an implantation peak depth of the N type impurity shallower than the depth T30. Next, the manufacturing apparatus forms the trench 30 by etching the trench forming region. After that, the manufacturing apparatus removes the mask M1. The manufacturing apparatus can introduce more N type impurity into the side surface 30b than the bottom surface 30a of the trench 30 also by such a method.

In the case of performing the ion implantation of the N type impurity before forming the trench 30 as described above, the manufacturing apparatus may perform the ion implantation multiple times while varying the implantation peak depth. For example, the manufacturing apparatus performs first ion implantation in the GaN layer 20 to the trench forming region exposed from the mask M1. In the first ion implantation, the implantation peak depth of the N type impurity is made shallower than the depth T30. Next, the manufacturing apparatus performs second ion implantation to the trench forming region exposed from the mask M1. In the second ion implantation, the implantation peak depth of the N type impurity is made further shallower than that in the first ion implantation. After the second ion implantation, the manufacturing apparatus forms the trench 30 by etching the trench forming region. After that, the manufacturing apparatus removes the mask M1. The manufacturing apparatus can introduce more N type impurity into the side surface 30b than the bottom surface 30a of the trench 30 also by such a method.

Figure 4C:
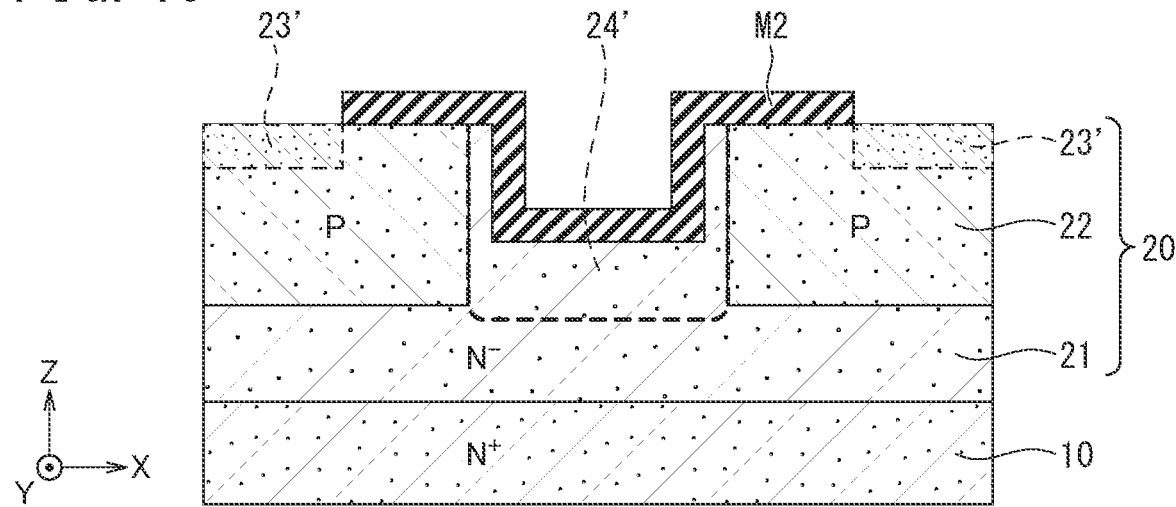

Next, as illustrated in FIG. 4C, the manufacturing apparatus performs ion implantation of Si as an N type impurity in the GaN layer 20 to a region 23' in which the source region 23 (refer to FIG. 2) is to be formed (hereinafter, a source forming region). For example, the manufacturing apparatus forms a mask M2 on the GaN layer 20. The mask M2 is composed of a SiO$_2$ film, an Al$_2$O$_3$ film, or a photoresist. The mask M2 has a shape in which the upper part of the source forming region 23' is opened and the upper part of the other region is covered. The manufacturing apparatus performs ion implantation of Si to the GaN layer 20 on which the mask M2 is formed. After the ion implantation, the manufacturing apparatus removes the mask M2 from the GaN layer 20.

Figure 4D:
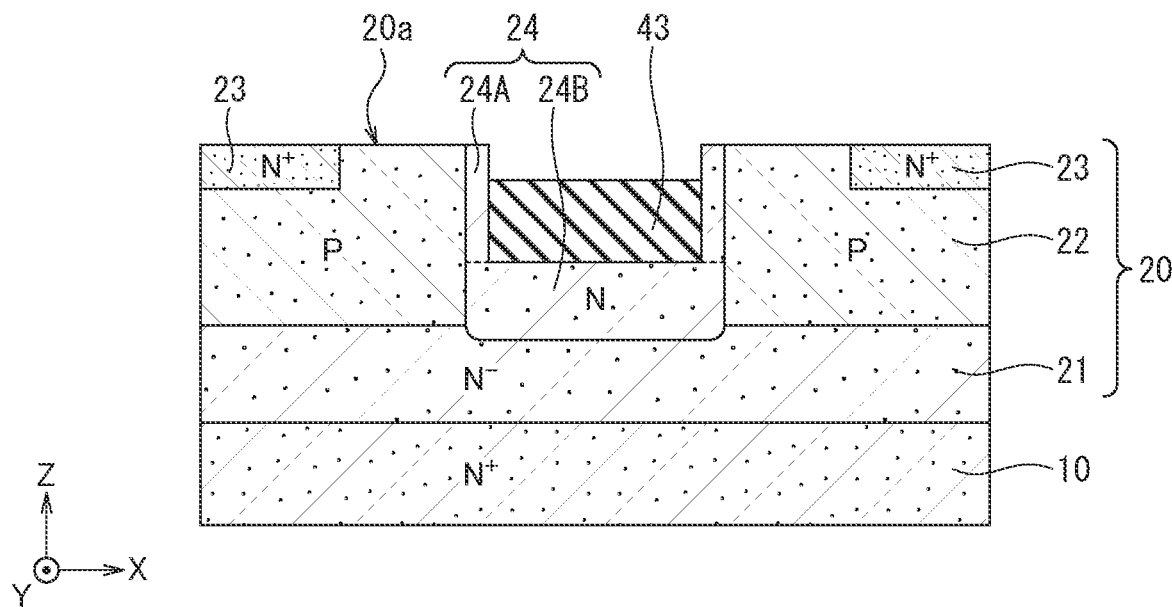

Next, the manufacturing apparatus performs heat treatment whose maximum temperature is 1000° C. or more and 1200° C. or less for a laminate including the GaN substrate 10 and the GaN layer 20. The heat treatment is, for example, a rapid thermal process. The N type impurity such as Si and O and the P type impurity such as Mg introduced into the GaN layer 20 are activated by the heat treatment. As illustrated in FIG. 4D, in the GaN layer 20, the JFET region 24 and the source region 23 are formed and the drift region 21 is defined. In addition, in the GaN layer 20, defects caused by the ion implantation can be recovered to some extent by the heat treatment.

In the heat treatment step, a protection film (not illustrated) may be formed on the surface 20a of the GaN layer 20 in advance. Preferably, the protection film has high heat resistance, does not diffuse the impurity to the side of the GaN layer 20 from the protection film, and can be selectively removed with respect to the GaN layer 20. Having high heat resistance means that the protection film is not substantially decomposed to such an extent that, for example, a pit (through opening) is not formed in the protection film even when the heat treatment is performed at a temperature of 1000° C. or more and 1200° C. or less. Examples of the protection film include an aluminum nitride (AlN) film, a $SiO_2$ film, and a silicon nitride (SiN) film. The protection film may be a laminate film in which another film is laminated on the AlN film. As another film, one or more among a $SiO_2$ film, a SiN film, and a GaN film are exemplified.

Next, the manufacturing apparatus forms the insulating film 43 on the bottom surface 30a of the trench 30. For example, the manufacturing apparatus forms an insulating film on the surface 20a of the GaN layer 20 by a CVD method, and then, the insulating film is shaped into a predetermined shape using photolithography and etching technologies. Accordingly, the manufacturing apparatus forms the insulating film 43 on the bottom surface 30a of the trench 30.

Figure 4E:
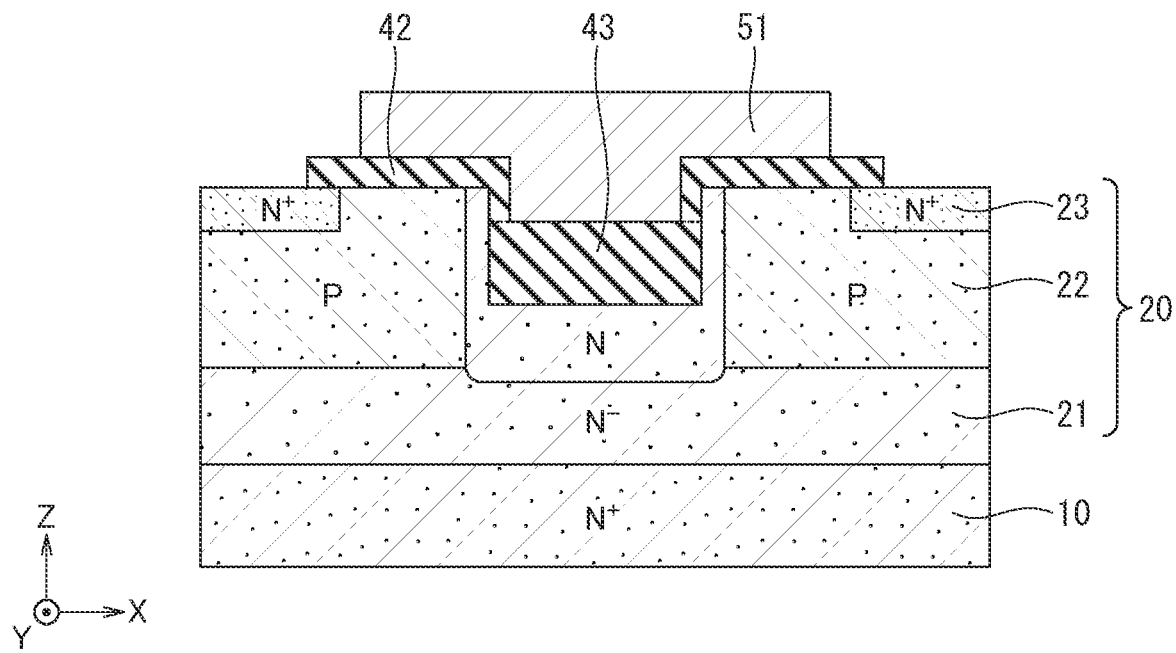

Next, as illustrated in FIG. 4E, the manufacturing apparatus forms the gate insulating film 42 on the well region 22. For example, the manufacturing apparatus forms an insulating film by a CVD method, and then, the insulating film is shaped into a predetermined shape using photolithography and etching technologies. Accordingly, the manufacturing apparatus forms the gate insulating film 42 on the well region 22. Next, the manufacturing apparatus sequentially forms the gate electrode 51, the source electrode 53 (refer to FIG. 2), and the drain electrode 55 (refer to FIG. 2). The vertical MOSFET 1 is completed after the above steps.

As described above, the vertical MOSFET 1 according to the first embodiment of the present disclosure includes the GaN layer 20, the N type source region 23, the P type well region 22, the trench 30, the N type JFET region 24, the insulating film 43, the gate insulating film 42, and the gate electrode 51. The N type source region 23 is provided on the side of the surface 20a of the GaN layer 20. The P type well region 22 is provided in the GaN layer 20 and is adjacent to the source region 23 in the X-axis direction and the Y-axis direction parallel to the surface 20a of the GaN layer 20 and in the Z-axis direction perpendicular to the X-axis direction and the Y-axis direction. The trench 30 is provided in the GaN layer 20 and is located on the opposite side of the source region 23 with the well region 22 sandwiched between the trench 30 and the source region 23 in the X-axis direction. The N type JFET region 24 is provided in the GaN layer 20 and is located between the well region 22 and the trench 30. The insulating film 43 is provided on the bottom surface 30a of the trench 30. The gate insulating film 42 is provided on the well region 22. The gate electrode 51 is provided from on the insulating film 43 to on the gate insulating film 42. The thickness T42 of the insulating film 43 is larger than the thickness T43 of the gate insulating film 42.

Accordingly, the thick insulating film 43 exists in the trench 30, so that a distance between the gate electrode 51 and the drain electrode 55 can be lengthened. Accordingly, the vertical MOSFET 1 can reduce a capacity Cgd of the gate electrode 51, which is generated between the gate electrode 51 and the drain electrode 55. In addition, the thick insulating film 43 that reduces the capacity Cgd is located in a position separated from between the gate electrode 51 and the channel, and thus, a threshold voltage Vth of the vertical MOSFET 1 is not affected by the thickness of the insulating film 43. Accordingly, the vertical MOSFET 1 can keep the controllability of the threshold voltage Vth high while reducing the capacity Cgd.

In addition, the channel of the vertical MOSFET 1 has a planar structure in which the channel is formed not on the side surface 30b of the trench 30 but in the vicinity of the surface of the well region 22. Therefore, an etching damage when forming the trench 30 can be prevented from extending to the channel. Accordingly, the vertical MOSFET 1 can keep a carrier mobility in the channel high while reducing the capacity Cgd of the gate electrode 51.

In addition, the vertical MOSFET 1 further includes, in the GaN layer 20, the N⁻ type drift region 21 provided between the side of the rear surface 20b of the GaN layer 20 and the JFET region 24 and adjacent to the well region 22 and the JFET region 24. The JFET region 24 has an N type impurity concentration higher than that of the drift region 21. Accordingly, the vertical MOSFET 1 can further suppress an increase in on-state resistance.

In addition, the JFET region 24 has the first JFET region 24A located between the well region 22 and the trench 30 in the X-axis direction, and the second JFET region 24B located between the rear surface 20b of the GaN layer 20 and the trench 30 and adjacent to the first JFET region 24A in the Z-axis direction. The first JFET region 24A has an N type impurity concentration higher than that of the second JFET region 24B. Accordingly, the first JFET region 24A functions as a current pathway along the side surface 30b of the trench 30. The current pathway possibly limits the on-state resistance, but the electrical resistance of the current pathway is reduced by an increase in the N type impurity concentration. Therefore, the vertical MOSFET 1 can further suppress the increase in on-state resistance.

First Modified Example

In the above first embodiment, the case where, in the process of epitaxially forming the GaN layer 20, the well region 22 is formed in the GaN layer 20 by changing the impurity contained in the GaN layer from the N type impurity to the P type impurity has been described. However, in the embodiments of the present invention, the forming method of the well region 22 is not limited thereto. In the embodiments of the present invention, the well region 22 may be formed by ion implantation.

Figure 5A:
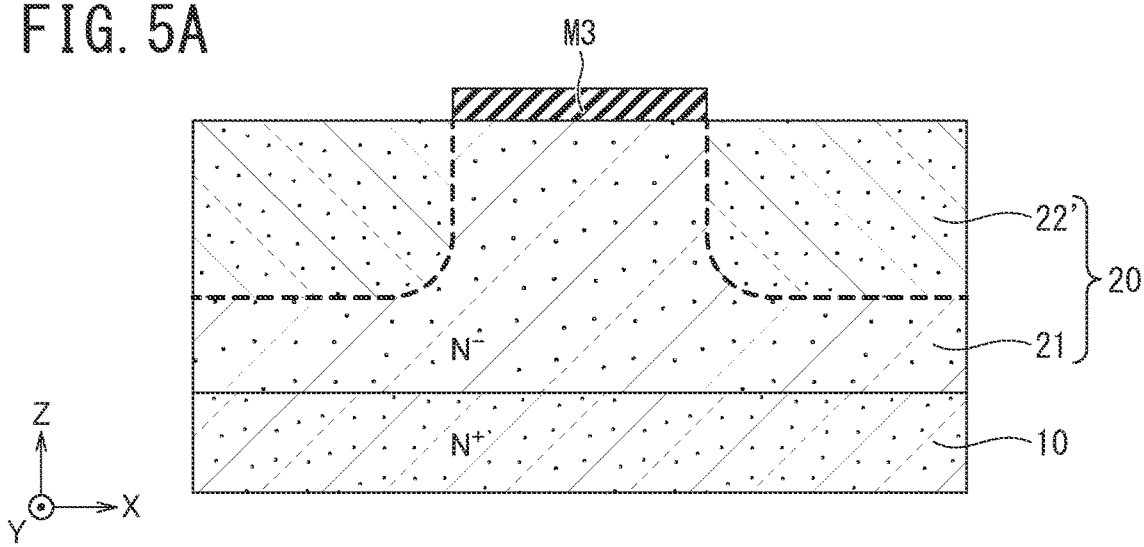
FIGS. 5A to 5E are cross-sectional views illustrating a manufacturing method (first modified example) of the vertical MOSFET according to the first embodiment of the present invention in the order of steps.

FIGS. 5A to 5E are cross-sectional views illustrating the manufacturing method (first modified example) of the vertical MOSFET 1 according to the first embodiment of the present invention in the order of steps. As illustrated in FIG. 5A, the manufacturing apparatus epitaxially forms the GaN layer 20 on the N⁺ type GaN substrate 10 by MOCVD, HVPE, or the like. In the forming step of the GaN layer 20, the drift region 21 containing Si as an N type impurity is formed.

Next, the manufacturing apparatus performs ion implantation of Mg as a P type impurity in the GaN layer 20 to a region 22' in which the well region 22 (refer to FIG. 2) is to be formed (hereinafter, a well forming region). For example, the manufacturing apparatus forms a mask M3 on the GaN layer 20. The mask M3 is composed of a $SiO_2$ film, an $Al_2O_3$ film, or a photoresist. The mask M3 has a shape in which the upper part of the well forming region 22' is opened and the upper part of the other region is covered. The manufacturing apparatus performs ion implantation of Mg to the GaN layer 20 on which the mask M3 is formed. After the ion implantation, the manufacturing apparatus removes the mask M3 from the GaN layer 20.

Next, the manufacturing apparatus performs ion implantation of Si as an N type impurity in the GaN layer 20 to the source forming region 23'. The method of the ion implantation of the N type impurity to the source forming region 23' is the same as the method described in the above first embodiment. For example, the manufacturing apparatus forms the mask M2 (refer to FIG. 4C) on the GaN layer 20 and performs ion implantation of Si to the GaN layer 20 on which the mask M2 is formed. After the ion implantation, the manufacturing apparatus removes the mask M2 from the GaN layer 20.

Figure 5B:
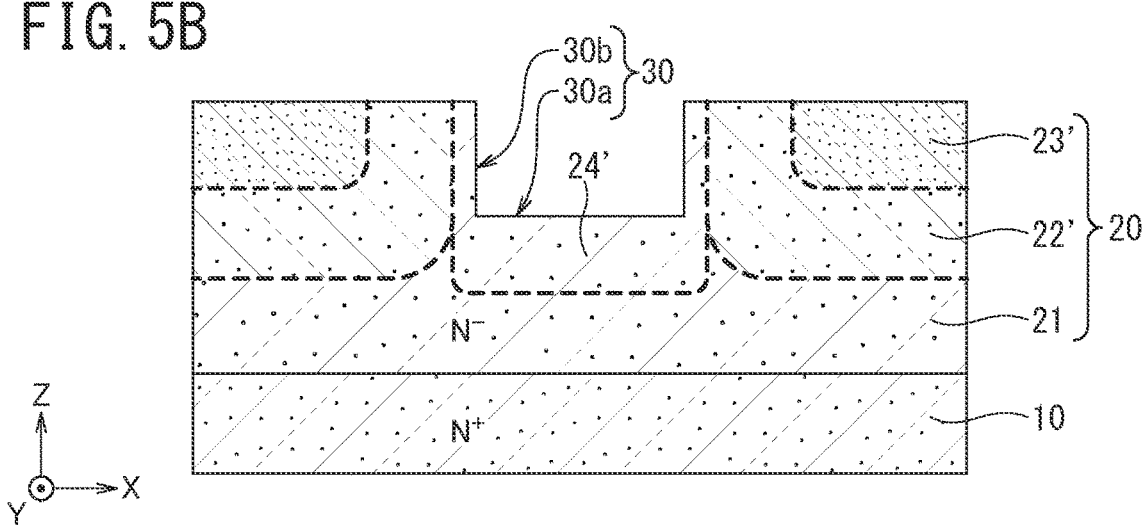

Next, as illustrated in FIG. 5B, the manufacturing apparatus forms the trench 30 in the GaN layer 20. The forming method of the trench 30 is the same as the method described in the above first embodiment. For example, the manufacturing apparatus forms the mask M1 (refer to FIG. 4B) on the GaN layer 20 and forms the trench 30 in the GaN layer 20 by etching the part exposed from the mask M1 in the GaN layer 20.

Next, the manufacturing apparatus performs ion implantation of O or Si as an N type impurity in the GaN layer 20 to the JFET forming region 24'. The method of the ion implantation of the N type impurity to the JFET forming region 24' is the same as the method described in the above first embodiment. For example, after performing first ion implantation to the bottom surface 30a and the side surface 30b of the trench 30, the manufacturing apparatus removes the mask M1. Next, the manufacturing apparatus forms the mask (not illustrated) having a shape in which the side surface 30b of the trench 30 is exposed and the other region (including the bottom surface 30a of the trench 30) is covered. Then, the manufacturing apparatus performs second ion implantation to the side surface exposed from the mask. Accordingly, the manufacturing apparatus can introduce more N type impurity into the side surface 30b than the bottom surface 30a of the trench 30.

Similar to the above first embodiment, also in the first modified example, the manufacturing apparatus may introduce more N type impurity into the side surface 30b of the trench 30 by performing ion implantation of an N type impurity before forming the trench 30. In addition, in the case of performing the ion implantation of the N type impurity before forming the trench 30, the manufacturing apparatus may perform the ion implantation multiple times while varying the implantation peak depth.

Figure 5C:
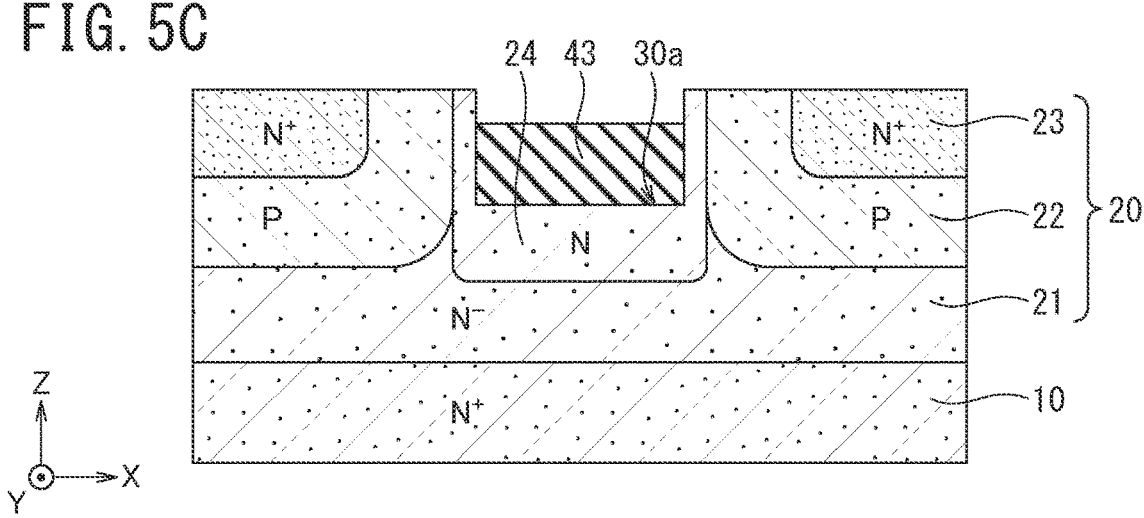

The subsequent steps are the same as those of the above first embodiment. The manufacturing apparatus performs heat treatment whose maximum temperature is 1000° C. or more and 1200° C. or less for the laminate including the GaN substrate 10 and the GaN layer 20. The N type impurity such as Si and O and the P type impurity such as Mg introduced into the GaN layer 20 are activated by the heat treatment. As illustrated in FIG. 5C, in the GaN layer 20, the JFET region 24 and the source region 23 are formed and the drift region 21 is defined. In addition, in the GaN layer 20, defects caused by the ion implantation can be recovered to some extent by the heat treatment.

Figure 5D:
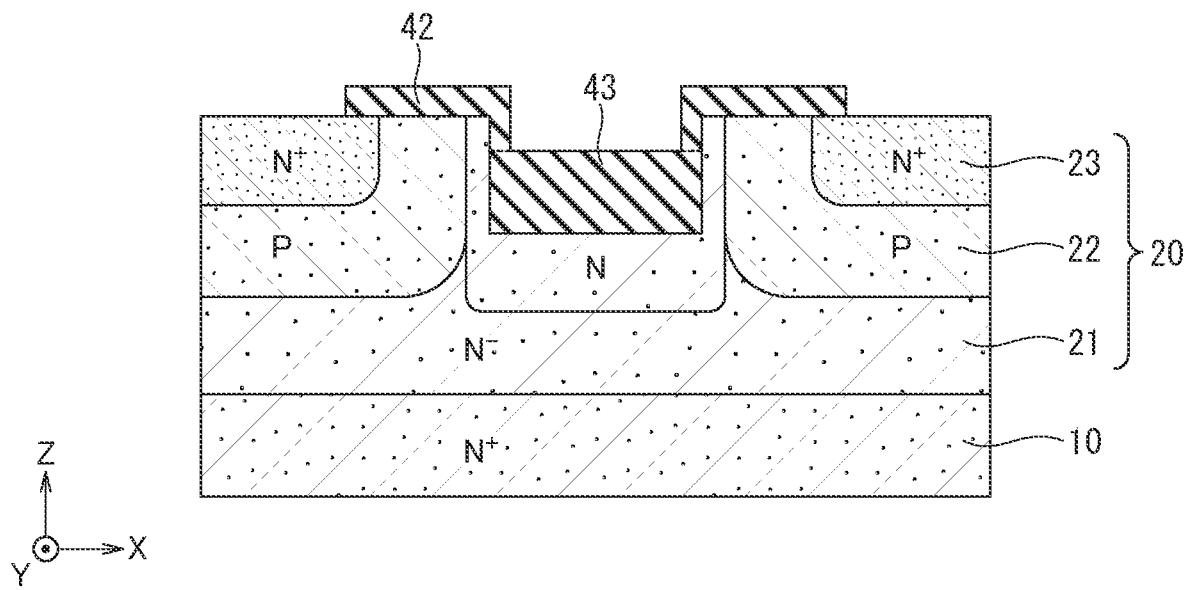
Figure 5E:
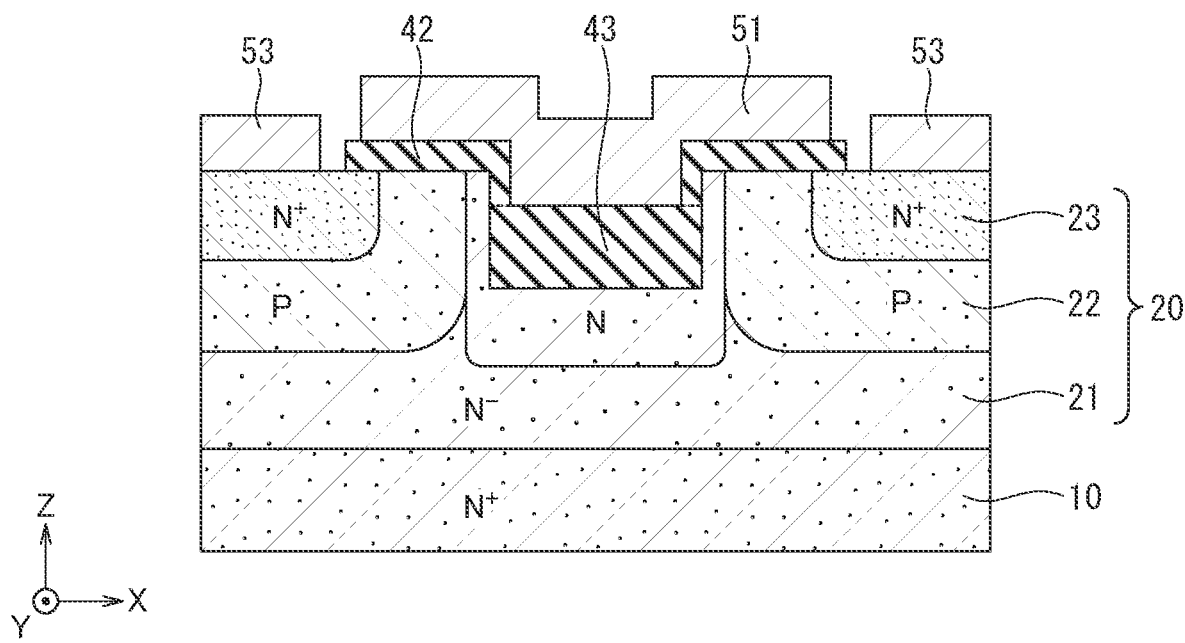

Next, the manufacturing apparatus forms the insulating film 43 on the bottom surface 30a of the trench 30. Next, as illustrated in FIG. 5D, the manufacturing apparatus forms the gate insulating film 42 on the well region 22. Next, the manufacturing apparatus sequentially forms the gate electrode 51, the source electrode 53, and the drain electrode 55 (refer to FIG. 2). The vertical MOSFET 1 is completed after the above steps.

Second Modified Example

In the above first embodiment and the first modified example thereof, the case where the second JFET region 24B is formed below the bottom surface 30a by introducing the N type impurity into the bottom surface 30a of the trench 30 has been described. However, in the embodiments of the present invention, the N type impurity may not be introduced into the bottom surface 30a of the trench 30. The second JFET region 24B may not exist below the bottom surface 30a of the trench 30.

Figure 6A:
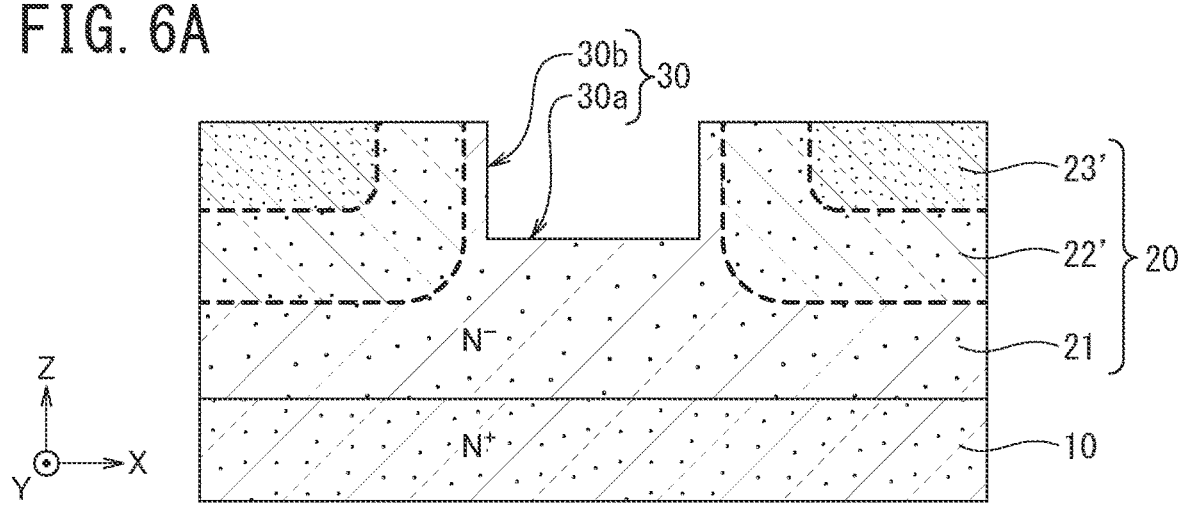
FIGS. 6A to 6C are cross-sectional views illustrating a manufacturing method (second modified example) of the vertical MOSFET according to the first embodiment of the present invention in the order of steps.
Figure 6B:
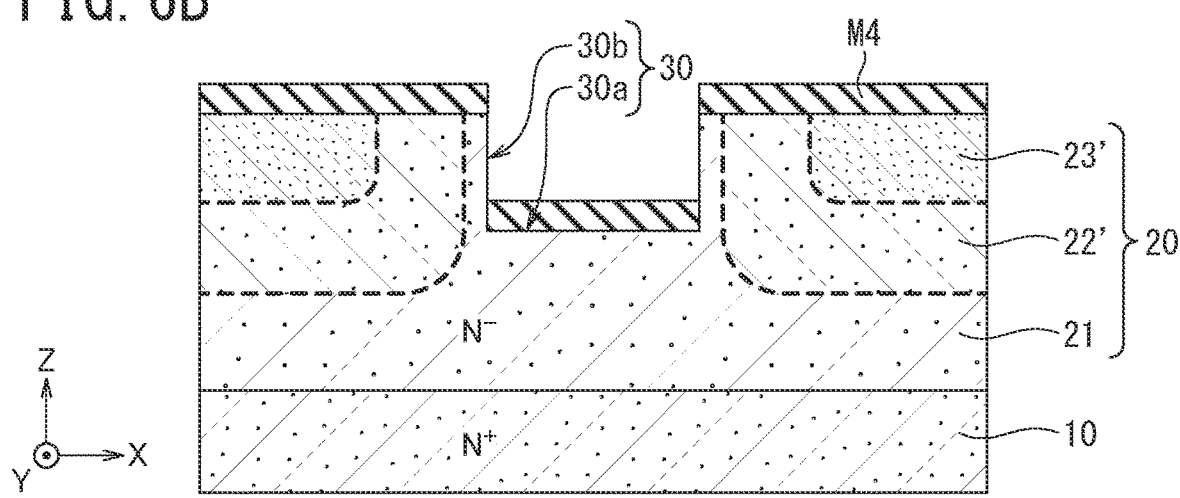
Figure 6C:
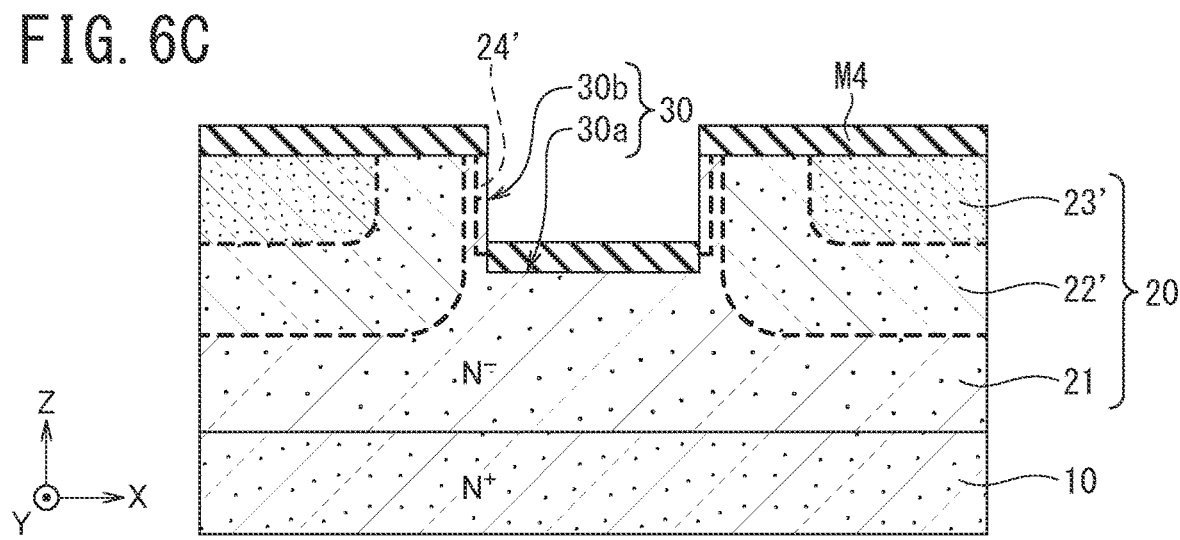

FIGS. 6A to 6C are cross-sectional views illustrating the manufacturing method (second modified example) of the vertical MOSFET 1 according to the first embodiment of the present invention in the order of steps. As illustrated in FIG. 6A, in the GaN layer 20, the steps of performing ion implantation of a P type impurity to the well forming region 22', performing ion implantation of an N type impurity to the source forming region 23', and forming the trench 30 are the same as those in the above first modified example. After forming the trench 30, as illustrated in FIG. 6B, the manufacturing apparatus forms a mask M4 on the GaN layer 20. The mask M4 is composed of a $SiO_2$ film, an $Al_2O_3$ film, or a photoresist. The mask M4 has a shape in which the surface 20a of the GaN layer 20 and the bottom surface 30a of the trench 30 are covered and the side surface of the trench 30 is exposed.

The manufacturing apparatus performs tilt-angle ion implantation of Si or O to the GaN layer 20 on which the mask M4 is formed. The tilt-angle ion implantation means ion implantation of an impurity in a direction intersecting with the depth direction of the trench 30 (Z-axis direction). Accordingly, the N type impurity can be introduced into the side surface 30b of the trench 30, and the N type impurity can be made not to be introduced into the bottom surface 30a of the trench 30. As illustrated in FIG. 6C, the JFET forming region 24' is formed on the side surface 30b of the trench 30, but the JFET forming region 24' is not formed on the bottom surface 30a of the trench 30. After the ion implantation, the manufacturing apparatus removes the mask M4 from the GaN layer 20.

The subsequent steps are the same as those of the above first embodiment. The manufacturing apparatus performs heat treatment for the laminate including the GaN substrate 10 and the GaN layer 20. Accordingly, the N type impurity and the P type impurity introduced into the GaN layer 20 are activated, in the GaN layer 20, the well region 22, the source region 23 (refer to FIG. 2), and the JFET region 24 (refer to FIG. 2) are formed, and the drift region 21 is defined. In the second modified example, the JFET region 24 is formed on the side surface 30b of the trench 30 but is not formed on the bottom surface 30a of the trench 30. The JFET region 24 formed on the side surface 30b of the trench 30 is in contact with the drift region 21 in the Z-axis direction.

Next, the manufacturing apparatus forms the insulating film 43 (refer to FIG. 2) on the bottom surface 30a of the trench 30 and forms the gate insulating film 42 (refer to FIG. 2) on the well region 22. Next, the manufacturing apparatus sequentially forms the gate electrode 51 (refer to FIG. 2), the source electrode 53 (refer to FIG. 2), and the drain electrode 55 (refer to FIG. 2). The vertical MOSFET 1 is completed after the above steps.

Second Embodiment

In the above first embodiment, a mode in which the N⁻ type drift region 21 and the P type well region 22 are adjacent in the Z-axis direction in the GaN layer 20 has been described. However, in the embodiments of the present invention, an impurity region having the same conductivity type as that of the well region 22 may exist between the drift region 21 and the well region 22. In addition, the electric potential of the impurity region may be fixed.

Figure 7:
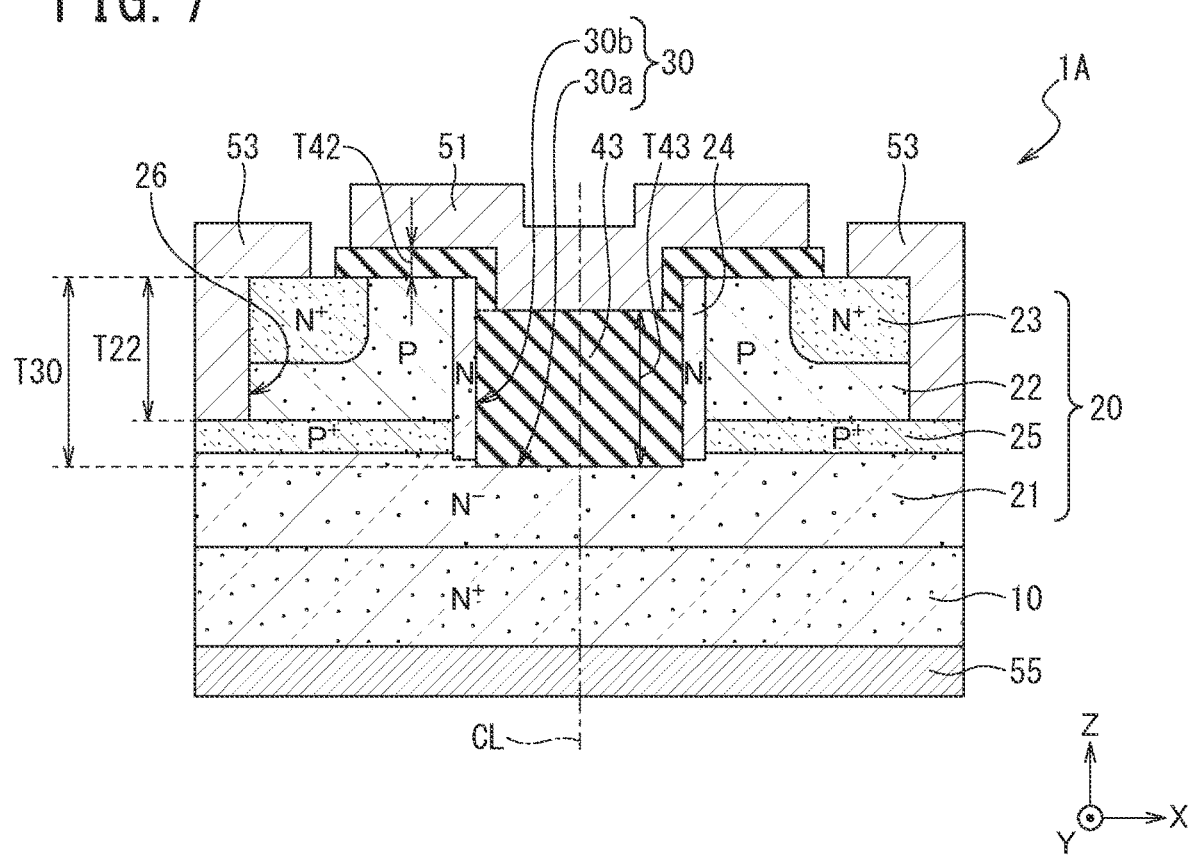
FIG. 7 is a cross-sectional view illustrating a configuration example of a vertical MOSFET according to a second embodiment of the present invention.

FIG. 7 is a cross-sectional view illustrating a configuration example of a vertical MOSFET 1A according to a second embodiment of the present invention. As illustrated in FIG. 7, in the vertical MOSFET 1A, the GaN layer 20 has a P$^+$ type impurity region (hereinafter, P$^+$ region) 25 arranged between the N$^-$ type drift region 21 and the P type well region 22. In the process of epitaxially forming the GaN layer 20, the P$^+$ region 25 is formed. For example, the P$^+$ region 25 is formed on the N$^-$ type drift region 21 by changing the impurity to be introduced into the GaN layer 20 from the N type impurity such as Si to the P type impurity such as Mg after forming the drift region 21. The thickness of the P$^+$ region 25 is, for example, 0.1 µm or more and 0.5 µm or less. The concentration of Mg in the P$^+$ region 25 is, for example, $5 \times 10^{18}$ cm$^{-3}$ or more and $5 \times 10^{19}$ cm$^{-3}$ or less. Accordingly, a depletion layer expands between the P$^+$ region 25 and the N$^-$ type drift region 21, thereby improving a breakdown voltage between the P$^+$ region 25 and the drift region 21.

A contact hole 26 whose bottom surface is the P$^+$ region 25 is provided in the GaN layer 20. The source electrode 53 is electrically connected to the P$^+$ region 25 through the contact hole 26. Accordingly, the electric potential of the P$^+$ region 25 and the electric potential of the P type well region 22 adjacent to the P$^+$ region 25 can be fixed to the source electric potential (for example, 0 V). When the electric potential of the well region 22 is fixed, property fluctuation of the vertical MOSFET 1 is suppressed.

In the second embodiment, the trench 30 is formed to be deeper than the well region 22. When a thickness of the trench 30 is defined as T30 and a thickness of the well region 22 is defined as T22, T30>T22 is satisfied. In addition, the JFET region 24 does not exist below the bottom surface 30a of the trench 30. The bottom surface 30a of the trench 30 is located on the drift region 21. The JFET region 24 is provided on only the side surface 30b of the trench 30. The JFET region 24 is in contact with the drift region 21 in the Z-axis direction.

Similar to the vertical MOSFET 1 described in the first embodiment, the vertical MOSFET 1A according to the second embodiment of the present invention includes the thick insulating film 43 in the trench 30. Accordingly, similar to the vertical MOSFET 1, the vertical MOSFET 1A can reduce the capacity Cgd of the gate electrode 51. In addition, the vertical MOSFET 1A includes the P$^+$ region 25 in the GaN layer 20. Accordingly, the vertical MOSFET 1A can improve a breakdown voltage and fix the electric potential of the well region 22 to suppress property fluctuation.

Third Embodiment

In the embodiments of the present invention, a region in which the second JFET region 24B exists below the bottom surface 30a of the trench 30 and a region in which the second JFET region 24B does not exist below the bottom surface 30a of the trench 30 may be mixed.

Figure 8:
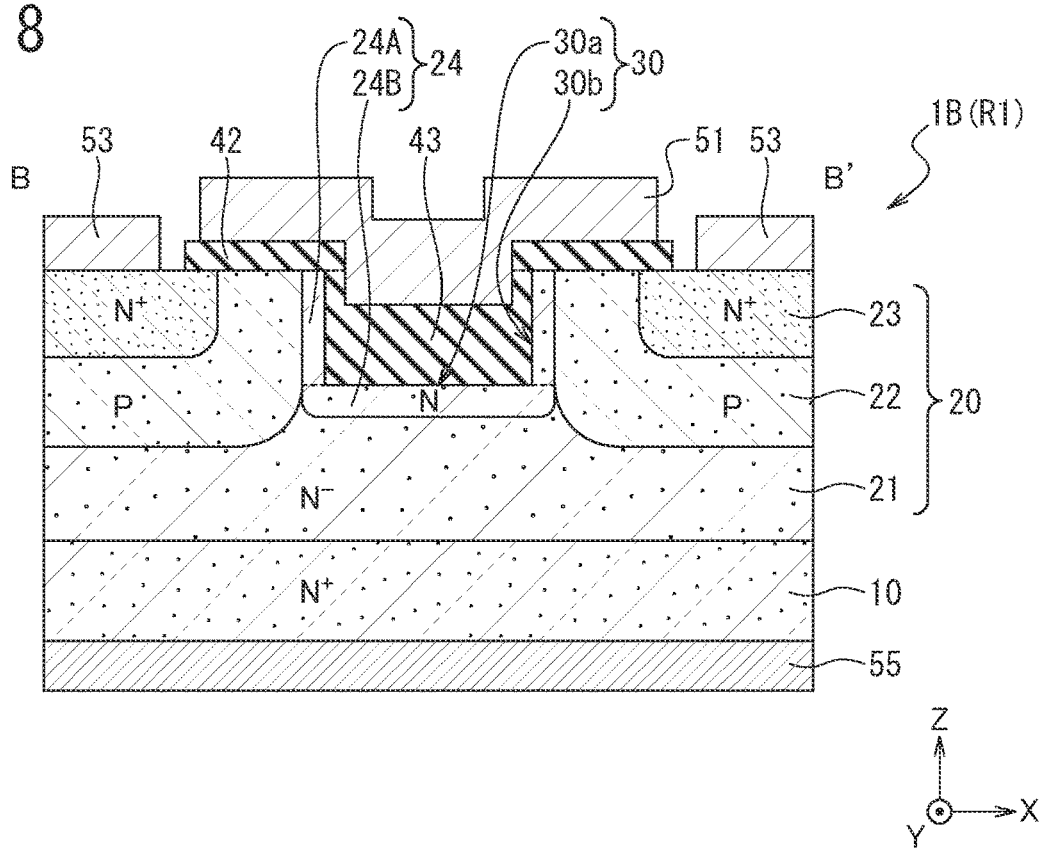
FIG. 8 is a cross-sectional view illustrating a configuration example of a vertical MOSFET according to a third embodiment of the present invention.
Figure 9:
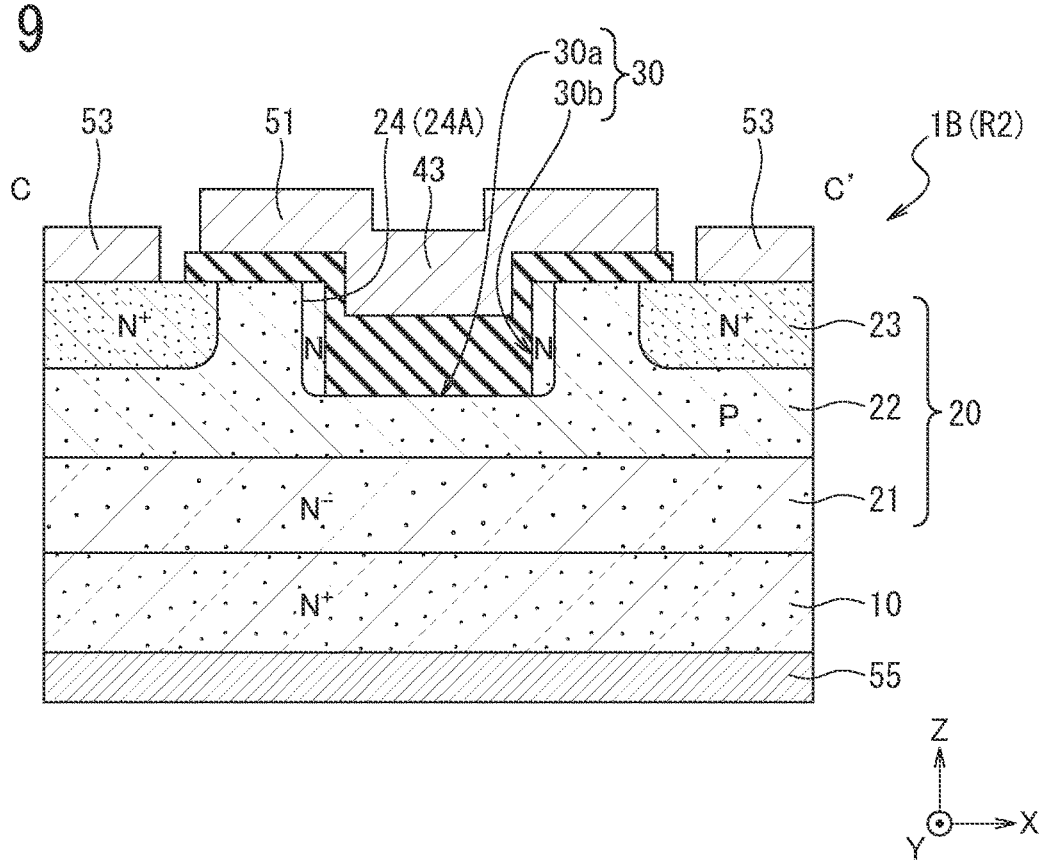
FIG. 9 is a cross-sectional view illustrating the configuration example of the vertical MOSFET according to the third embodiment of the present invention.
Figure 10:
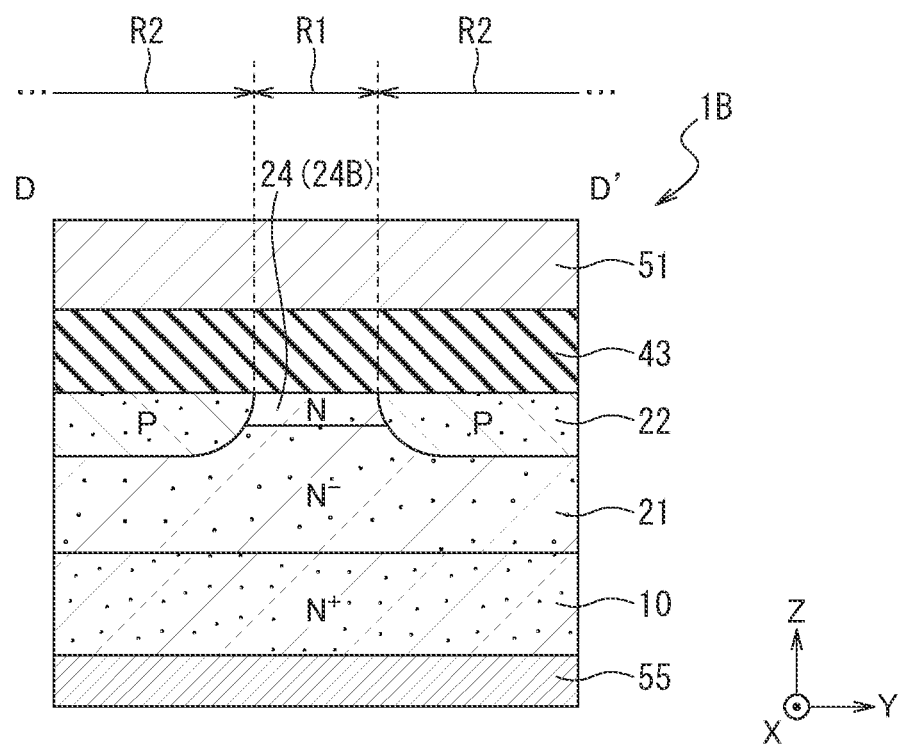
FIG. 10 is a cross-sectional view illustrating the configuration example of the vertical MOSFET according to the third embodiment of the present invention.
Figure 11:
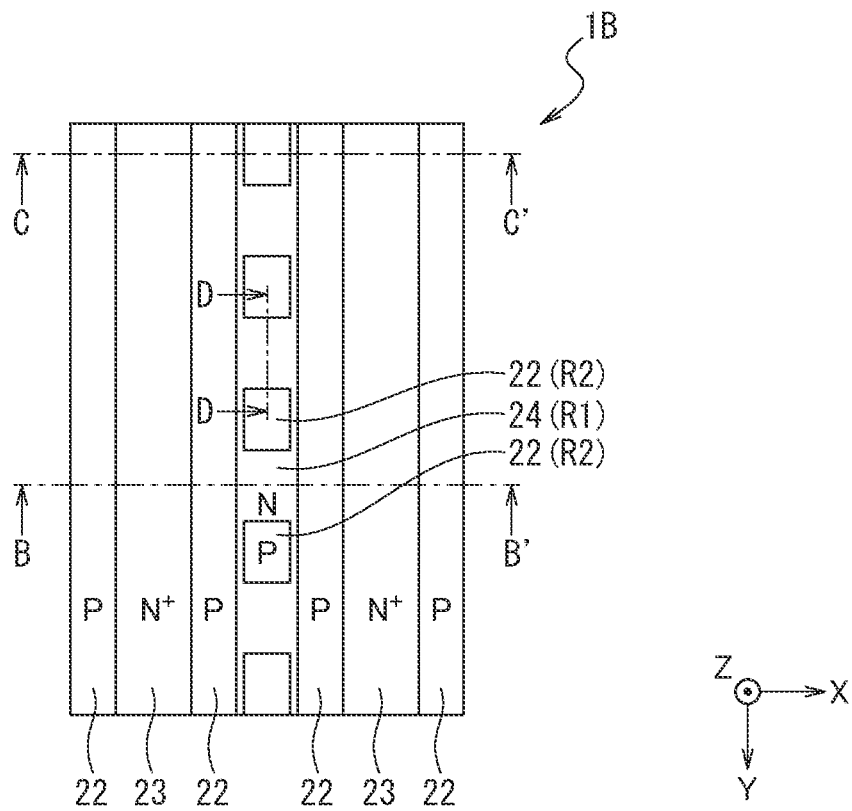
FIG. 11 is a plan view illustrating a configuration example of a side of a surface of a gallium nitride semiconductor layer in the vertical MOSFET according to the third embodiment of the present invention.

FIGS. 8 to 10 are cross-sectional views illustrating a configuration example of a vertical MOSFET 1B according to a third embodiment of the present invention. FIG. 11 is a plan view illustrating a configuration example of the side of the surface 20a of the GaN layer 20 in the vertical MOSFET 1B according to the third embodiment of the present invention. A cross-section cut along the line B-B' of FIG. 11 corresponds to the cross-sectional view of FIG. 8. A cross-section cut along the line C-C' of FIG. 11 corresponds to the cross-sectional view of FIG. 9. A cross-section cut along the line D-D' of FIG. 11 corresponds to the cross-sectional view of FIG. 10.

As illustrated in FIGS. 8 to 10, in the vertical MOSFET 1B, a first region R1 where the second JFET region 24B exists below the bottom surface 30a of the trench 30 and a second region R2 where the second JFET region 24B does not exist below the bottom surface 30a of the trench 30 are mixed. FIG. 8 illustrates the first region R1, and FIG. 9 illustrates the second region R2.

As illustrated in FIG. 8, in the first region R1, the N$^-$ type drift region 21 and the N type first JFET region 24A are electrically connected by the N type second JFET region 24B, and a current pathway from the drift region 21 to the first JFET region 24A is secured. In contrast, as illustrated in FIG. 9, in the second region R2, the P type well region 22 is interposed between the N$^-$ type drift region 21 and the N type first JFET region 24A, and the current pathway from the drift region 21 to the first JFET region 24A is blocked. As illustrated in FIG. 11, for example, the first region R1 and the second region R2 are alternatively arranged in the Y-axis direction.

Similar to the vertical MOSFET 1 described in the first embodiment, the vertical MOSFET 1B according to the third embodiment of the present invention includes the thick insulating film 43 in the trench 30. Accordingly, similar to the vertical MOSFET 1, the vertical MOSFET 1B can reduce the capacity Cgd of the gate electrode 51. In addition, the vertical MOSFET 1B includes the first region R1 where the second JFET region 24B exists below the bottom surface 30a of the trench 30 and the second region R2 where the second JFET region 24B does not exist below the bottom surface 30a of the trench 30. In the second region R2, a depletion layer is formed between the P type well region 22 and the N$^-$ type drift region 21, and thus, a dielectric constant between the gate electrode 51 and the drain electrode 55 becomes lower compared to in the first region R1. Accordingly, the vertical MOSFET 1A can further reduce the capacity Cgd of the gate electrode 51.

Other Embodiments

As described above, the present invention has been described by the embodiments and the modified examples. However, it should not be understood that the description and the drawings which constitute a part of the present disclosure limit the present invention. From the present disclosure, various alternative embodiments and modified examples will be easily found by those skilled in the art.

For example, for the gate insulating film 42, a silicon oxynitride (SiON) film, a strontium oxide (SrO) film, and a silicon nitride (Si$_3$N$_4$) film can also be used. In addition, for the gate insulating film 42, a composite film in which multiple single-layered insulating films are laminated, or the like can also be used. A vertical MOSFET using, as the gate insulating film 42, an insulating film other than a SiO$_2$ film may be referred to as a vertical MISFET. The MISFET means a more comprehensive insulated gate transistor including a MOSFET.

In addition, in FIG. 3 and FIG. 11, a mode in which the well region 22 and the source region 23 respectively extend in the Y-axis direction and are arranged in a stripe shape is illustrated. However, in the embodiments of the present invention, the arrangement of the well region 22 and the source region 23 is not limited to the stripe shape.

Figure 12:
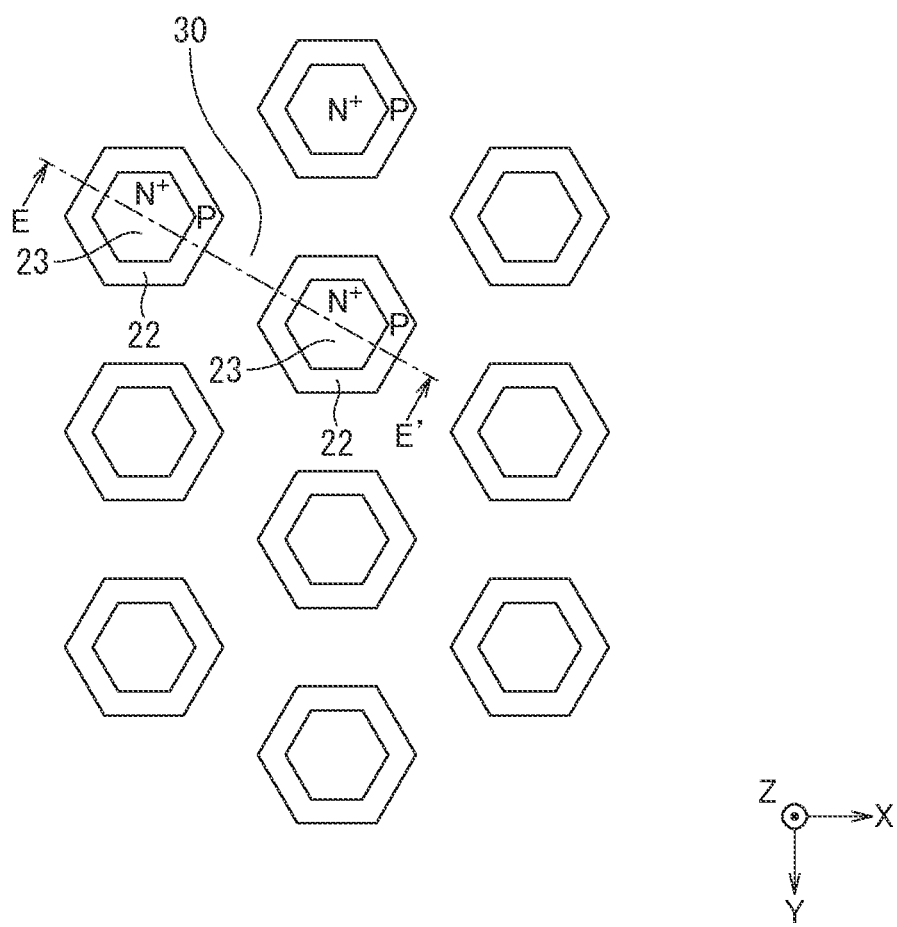
FIG. 12 is a plan view illustrating a configuration example of a vertical MOSFET according to a modified example of the embodiments of the present invention.

FIG. 12 is a plan view illustrating a configuration example of a vertical MOSFET according to a modified example of the embodiments of the present invention. As illustrated in FIG. 12, the well region 22 and the source region 23 may be arranged in an island shape. In addition, the shape of the well region 22 and the source region 23 in a plan view may be a circular shape, an oval shape, or a polygonal shape. In one example, the octagonal source region 23 may be arranged on the inside of the octagonal well region 22, and islands each of which is composed of the well region 22 and the source region 23 may be arranged at regular intervals in the X-axis direction and the Y-axis direction. The trench 30 is arranged between one well region 22 and the other well region 22 which are adjacent to each other, and the insulating film 43 (refer to FIG. 2) thicker than the gate insulating film 42 (refer to FIG. 2) is arranged in the trench 30. Similar to the above embodiments, the capacity Cgd of the gate electrode 51 can be reduced also in such a mode. In this example, a cross-section cut along the line E-E' of FIG. 12 corresponds to FIG. 2, FIG. 7, or FIG. 8.

As described above, it is certain that the present invention includes various embodiments and the like which are not described herein. At least one of various kinds of omission, replacement, and modification can be made for the components without departing from the scope of the above-described embodiments and modified examples. In addition, the effects described herein are merely exemplified and not limitative, and furthermore, other effects may be exerted. The technical scope of the present invention is defined solely by matters specifying the invention according to claims as deemed appropriate to the above description.

The present invention can also have the following structures.

(1) A nitride semiconductor device including: a nitride semiconductor layer; a first conductivity type source region provided on a side of a surface of the nitride semiconductor layer; a second conductivity type well region provided in the nitride semiconductor layer and adjacent to the source region in a first direction parallel to the surface of the nitride semiconductor layer and in a second direction intersecting with the first direction; a trench provided in the nitride semiconductor layer and located on the opposite side of the source region with the well region sandwiched between the trench and the source region in the first direction; a first conductivity type impurity region provided in the nitride semiconductor layer and located between the well region and the trench; an insulating film provided on a bottom surface of the trench; a gate insulating film provided on the well region; and a gate electrode provided from on the insulating film to on the gate insulating film, in which a thickness of the insulating film is larger than a thickness of the gate insulating film.

(2) The nitride semiconductor device according to (1), further including: in the nitride semiconductor layer, a first conductivity type drift region provided between a side of a rear surface of the nitride semiconductor layer, which is the opposite side of the surface, and the impurity region and adjacent to the well region and the impurity region, in which the impurity region has a first conductivity type impurity concentration higher than that of the drift region.

(3) The nitride semiconductor device according to (1) or (2), in which the impurity region has a first impurity region located between the well region and the trench, and a second impurity region located between a rear surface of the nitride semiconductor layer, which is the opposite side of the surface, and the trench and adjacent to the first impurity region, and the first impurity region has a first conductivity type impurity concentration higher than that of the second impurity region.

(4) The nitride semiconductor device according to any one of (1) to (3), in which the impurity region has a first impurity region located between the well region and the trench, and a second impurity region located between a rear surface of the nitride semiconductor layer, which is the opposite side of the surface, and the trench and adjacent to the first impurity region, the first conductivity type is an N type and the second conductivity type is a P type, and when, in the well region, an acceptor concentration obtained by subtracting an N type impurity concentration from a P type impurity concentration is defined as Na, in the well region, a length of a part covered with the gate insulating film in the first direction is defined as da, in the first impurity region, a donor concentration obtained by subtracting a P type impurity concentration from an N type impurity concentration is defined as Nd1, a length of the first impurity region in the second direction is defined as dd1, a donor concentration in the second impurity region is defined as Nd2, and a length of the second impurity region in the second direction is defined as dd2, Na×da>Nd1×dd1×>Nd2×dd2 is satisfied.

(5) The nitride semiconductor device according to any one of (1) to (3), in which the impurity region has a first impurity region located between the well region and the trench, and a second impurity region located between a rear surface of the nitride semiconductor layer, which is the opposite side of the surface, and the trench and adjacent to the first impurity region, and when a second conductivity type impurity concentration in the well region is defined as NA, in the well region, a length of a part covered with the gate insulating film in the first direction is defined as da, a first conductivity type impurity concentration in the first impurity region is defined as ND1, a length of the first impurity region in the second direction is defined as dd1, a first conductivity type impurity concentration in the second impurity region is defined as ND2, and a length of the second impurity region in the second direction is defined as dd2, NA×da>ND1×dd1>ND2×dd2 is satisfied.

(6) The nitride semiconductor device according to any one of (1) to (5), in which a depth from the surface of the nitride semiconductor layer to the bottom surface of the trench is shallower than a depth from the surface of the nitride semiconductor layer to a bottom surface of the well region.

(7) The nitride semiconductor device according to any one of (1) to (5), further including: a second conductivity type high-concentration impurity region adjacent to the well region and having a second conductivity type impurity concentration higher than that of the well region.

(8) The nitride semiconductor device according to (7), in which a depth from the surface of the nitride semiconductor layer to the bottom surface of the trench is deeper than a depth from the surface of the nitride semiconductor layer to a bottom surface of the high-concentration impurity region.

(9) The nitride semiconductor device according to any one of (3) to (5), further including: a first region where the first impurity region and the second impurity region exist as the impurity region; and a second region where the first impurity region exists as the impurity region and the second impurity region does not exist.

REFERENCE SIGNS LIST 1, 1A, 1B vertical MOSFET
10 GaN substrate 10a, 20a surface
20 GaN layer
20b rear surface
21 drift region
22 well region
22' well forming region
22-1 first well region
22-2 second well region
23 source region
23' source forming region
23-1 first source region
23-2 second source region
24 JFET region
24' JFET forming region
24A first JFET region
24B second JFET region
25 P$^+$ region
26 contact hole
30 trench
30a bottom surface
30b side surface
42 gate insulating film
43 insulating film
51 gate electrode
53 source electrode
55 drain electrode
100 GaN semiconductor device
110 active region
112 gate pad
114 source pad
130 edge termination region
Cgd capacity
CL virtual line
M1, M2, M3, M4 mask
R1 first region
R2 second region

The invention claimed is:

1. A nitride semiconductor device, comprising:
a nitride semiconductor layer;
a first conductivity type source region provided on a side of a surface of the nitride semiconductor layer;
a second conductivity type well region provided in the nitride semiconductor layer and adjacent to the source region in a first direction parallel to the surface of the nitride semiconductor layer and in a second direction intersecting with the first direction;
a trench provided in the nitride semiconductor layer and located on the opposite side of the source region with the well region sandwiched between the trench and the source region in the first direction;
a first conductivity type impurity region provided in the nitride semiconductor layer, wherein the impurity region includes:
a first impurity region located in the first direction between the well region and the trench, and
a second impurity region located in the second direction between a rear surface of the nitride semiconductor layer, which is the opposite side of the surface, and the trench, and located adjacent to the first impurity region in the second direction;
an insulating film provided on a bottom surface of the trench;
a gate insulating film provided on the well region; and
a gate electrode provided from on the insulating film to on the gate insulating film, wherein
a thickness of the insulating film is larger than a thickness of the gate insulating film.

2. The nitride semiconductor device according to claim 1, further comprising:
in the nitride semiconductor layer, a first conductivity type drift region provided between a side of a rear surface of the nitride semiconductor layer, which is the opposite side of the surface, and the impurity region and adjacent to the well region and the impurity region, wherein
the impurity region has a first conductivity type impurity concentration higher than that of the drift region.

3. The nitride semiconductor device according to claim 1, wherein
the first impurity region has a first conductivity type impurity concentration higher than that of the second impurity region.

4. The nitride semiconductor device according to claim 3, further comprising:
a first region where the first impurity region and the second impurity region exist as the impurity region; and
a second region where the first impurity region exists as the impurity region and the second impurity region does not exist.

5. The nitride semiconductor device according to claim 1, wherein
the first conductivity type is an N type and the second conductivity type is a P type, and
when, in the well region, an acceptor concentration obtained by subtracting an N type impurity concentration from a P type impurity concentration is defined as Na, in the well region, a length of a part covered with the gate insulating film in the first direction is defined as da, in the first impurity region, a donor concentration obtained by subtracting a P type impurity concentration from an N type impurity concentration is defined as Nd1, a length of the first impurity region in the second direction is defined as dd1, a donor concentration in the second impurity region is defined as Nd2, and a length of the second impurity region in the second direction is defined as dd2, Na×da>Nd1×dd1>Nd2×dd2 is satisfied.

6. The nitride semiconductor device according to claim 1, wherein
a depth from the surface of the nitride semiconductor layer to the bottom surface of the trench is shallower than a depth from the surface of the nitride semiconductor layer to a bottom surface of the well region.

7. A nitride semiconductor device, comprising:
a nitride semiconductor layer;
a first conductivity type source region provided on a side of a surface of the nitride semiconductor layer;
a second conductivity type well region provided in the nitride semiconductor layer and adjacent to the source region in a first direction parallel to the surface of the nitride semiconductor layer and in a second direction intersecting with the first direction;
a trench provided in the nitride semiconductor layer and located on the opposite side of the source region with the well region sandwiched between the trench and the source region in the first direction;
a first conductivity type impurity region provided in the nitride semiconductor layer and located in the first direction between the well region and the trench;
a second conductivity type high-concentration impurity region located in the second direction between a rear surface of the nitride semiconductor layer, which is the opposite side of the surface, and a bottom surface of the well region, and located in the first direction adjacent to the first conductivity type impurity region and the trench, the second conductivity type high-concentration impurity region having a second conductivity type impurity concentration higher than that of the well region.

8. The nitride semiconductor device according to claim 7, wherein
a depth from the surface of the nitride semiconductor layer to the bottom surface of the trench is deeper than a depth from the surface of the nitride semiconductor layer to a bottom surface of the high-concentration impurity region.

9. The nitride semiconductor device according to claim 7, wherein
a depth from the surface of the nitride semiconductor layer to the bottom surface of the trench is deeper than a depth from the surface of the nitride semiconductor layer to a bottom surface of the high-concentration impurity region.

10. A nitride semiconductor device, comprising:
a nitride semiconductor layer;
a first conductivity type source region provided on a side of a surface of the nitride semiconductor layer;
a second conductivity type well region provided in the nitride semiconductor layer and adjacent to the source region in a first direction parallel to the surface of the nitride semiconductor layer and in a second direction intersecting with the first direction;
a trench provided in the nitride semiconductor layer and located on the opposite side of the source region with the well region sandwiched between the trench and the source region in the first direction;
a first conductivity type impurity region provided in the nitride semiconductor layer and located between the well region and the trench;
an insulating film provided on a bottom surface of the trench;
a gate insulating film provided on the well region; and
a gate electrode provided from on the insulating film to on the gate insulating film, wherein
a depth from the surface of the nitride semiconductor layer to the bottom surface of the trench is deeper than a depth from the surface of the nitride semiconductor layer to a bottom surface of the well region, and
a thickness of the insulating film is larger than a thickness of the gate insulating film.

11. The nitride semiconductor device according to claim 10, further comprising:
a second conductivity type high-concentration impurity region adjacent to the well region and having a second conductivity type impurity concentration higher than that of the well region.

* * * * *